US012666571B2

(12) United States Patent
Wu et al.

(10) Patent No.: US 12,666,571 B2
(45) Date of Patent: Jun. 23, 2026

(54) FLUID COLLECTING APPARATUS, COOLING SYSTEM AND METHOD OF OPERATING THE SAME

(71) Applicant: TAIWAN SEMICONDUCTOR MANUFACTURING COMPANY LTD., Hsinchu City (TW)

(72) Inventors: Kuo Yang Wu, Taoyuan City (TW); Shih-Ming Wang, Hsinchu City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 302 days.

(21) Appl. No.: 18/365,188

(22) Filed: Aug. 3, 2023

(65) Prior Publication Data

US 2023/0380108 A1 Nov. 23, 2023

Related U.S. Application Data

(62) Division of application No. 17/214,058, filed on Mar. 26, 2021, now Pat. No. 11,839,053.

(51) Int. Cl.
H05K 7/20 (2006.01)

(52) U.S. Cl.
CPC ..... H05K 7/20327 (2013.01); H05K 7/20136 (2013.01); H05K 7/203 (2013.01); H05K 7/20318 (2013.01)

(58) Field of Classification Search
CPC ........... H05K 7/20327; H05K 7/20136; H05K 7/203; H05K 7/20318
USPC ................................................... 361/679.47
See application file for complete search history.

(56) References Cited

U.S. PATENT DOCUMENTS

| | | | | |
|---|---|---|---|---|
| 1,612,265 A | * | 12/1926 | Cross ................... | B01D 5/0006 196/139 |
| 2,428,768 A | * | 10/1947 | Bertram ................... | B01D 1/14 122/459 |
| 3,986,835 A | * | 10/1976 | Takagi ................. | B08B 15/023 422/903 |
| 4,059,903 A | * | 11/1977 | Piet ...................... | A61C 19/007 422/504 |

(Continued)

FOREIGN PATENT DOCUMENTS

CN              108882651 A   *  11/2018  ......... H05K 7/20272

*Primary Examiner* — Anatoly Vortman
(74) *Attorney, Agent, or Firm* — WPAT Law; Anthony King

(57) ABSTRACT

A fluid collecting apparatus includes a housing, a gripping member, an inlet, and an outlet. The housing includes a chamber. The gripping member is movable within the chamber, extendable toward or retractable away from a tank, and is configured to hold a computing device. The inlet is communicable with the chamber and configured to deliver a gas into the chamber. The outlet is communicable with the chamber and configured to discharge the gas out of the chamber. A method of operating a cooling system includes receiving the tank, a coolant held by the tank, and a computing device immersed in the coolant, disposing the fluid collecting apparatus over the tank, moving the computing device into the chamber by the gripping member; supplying a gas from the inlet to be blown against the computing device; and discharging the gas and a vaporized coolant out of the chamber through the outlet.

20 Claims, 16 Drawing Sheets

(56)                References Cited

U.S. PATENT DOCUMENTS

| | | | | |
|---|---|---|---|---|
| 5,099,908 | A * | 3/1992 | Taraci | G01R 31/2891 |
| | | | | 374/57 |
| 5,119,021 | A * | 6/1992 | Taraci | G05D 23/01 |
| | | | | 165/80.4 |
| 5,293,754 | A * | 3/1994 | Mizuno | H01L 23/473 |
| | | | | 165/286 |
| 5,297,005 | A * | 3/1994 | Gourdine | H05K 7/20154 |
| | | | | 361/695 |
| 5,594,200 | A * | 1/1997 | Ramsey | H05K 9/0069 |
| | | | | 174/382 |
| 5,734,551 | A * | 3/1998 | Hileman | G06F 1/185 |
| | | | | 361/801 |
| 5,855,374 | A * | 1/1999 | Shoemaker, Jr. | G07F 17/3297 |
| | | | | 273/447 |
| 5,963,424 | A * | 10/1999 | Hileman | G06F 1/206 |
| | | | | 361/679.48 |
| 5,980,281 | A * | 11/1999 | Neal | H01R 12/7005 |
| | | | | 439/157 |
| 6,234,487 | B1 * | 5/2001 | Shoemaker, Jr. | B25J 15/0246 |
| | | | | 273/447 |
| 6,671,181 | B2 * | 12/2003 | Kaminski | H05K 7/1405 |
| | | | | 361/755 |
| 6,678,157 | B1 * | 1/2004 | Bestwick | H05K 7/20163 |
| | | | | 165/104.34 |
| 6,712,677 | B2 * | 3/2004 | Williams | B24C 9/00 |
| | | | | 451/89 |
| 6,770,001 | B1 * | 8/2004 | Shoemaker, Jr. | G07F 11/1657 |
| | | | | 273/448 |
| 6,878,046 | B2 * | 4/2005 | Publ | B24C 9/00 |
| | | | | 451/36 |
| 7,031,154 | B2 * | 4/2006 | Bash | H05K 7/20736 |
| | | | | 236/49.5 |
| 7,364,447 | B1 * | 4/2008 | Desrosiers | G06F 1/186 |
| | | | | 439/372 |
| 7,433,188 | B2 * | 10/2008 | Miller | G01R 31/2863 |
| | | | | 361/689 |
| 7,447,021 | B2 * | 11/2008 | Chen | H05K 7/20727 |
| | | | | 361/679.48 |
| 7,857,318 | B1 * | 12/2010 | Shoemaker, Jr. | G07F 17/3297 |
| | | | | 273/447 |
| 8,014,150 | B2 * | 9/2011 | Campbell | H05K 7/20809 |
| | | | | 165/185 |
| 8,248,805 | B2 * | 8/2012 | Brandon | H01R 12/7029 |
| | | | | 361/720 |
| 8,806,749 | B2 * | 8/2014 | Campbell | H05K 7/20772 |
| | | | | 174/15.1 |
| 10,820,446 | B2 * | 10/2020 | Boyd | H05K 7/20236 |
| 10,863,649 | B2 * | 12/2020 | Chen | G06F 1/20 |
| 10,969,842 | B2 * | 4/2021 | Enright | H05K 7/1492 |
| 11,129,298 | B2 * | 9/2021 | Enright | H05K 7/203 |
| 11,744,043 | B2 * | 8/2023 | Gao | H05K 7/20318 |
| | | | | 361/679.53 |
| 2004/0240175 | A1 * | 12/2004 | Brovald | G06F 1/20 |
| | | | | 361/679.5 |
| 2006/0094489 | A1 * | 5/2006 | Fukazawa | A63F 9/24 |
| | | | | 463/7 |
| 2007/0114725 | A1 * | 5/2007 | Peck | G07F 17/3253 |
| | | | | 273/447 |
| 2010/0175851 | A1 * | 7/2010 | Heydari | H01L 23/427 |
| | | | | 165/104.33 |
| 2010/0328891 | A1 * | 12/2010 | Campbell | H05K 7/20318 |
| | | | | 165/104.33 |
| 2013/0019614 | A1 * | 1/2013 | Campbell | H05K 7/20209 |
| | | | | 62/62 |
| 2014/0071626 | A1 * | 3/2014 | Campbell | B23P 15/26 |
| | | | | 165/165 |
| 2014/0218858 | A1 * | 8/2014 | Shelnutt | H05K 7/203 |
| | | | | 361/679.31 |
| 2014/0218859 | A1 * | 8/2014 | Shelnutt | H05K 7/20809 |
| | | | | 361/679.46 |
| 2018/0084670 | A1 * | 3/2018 | Hirai | H05K 7/20272 |
| 2018/0330577 | A1 * | 11/2018 | Shoemaker, Jr. | G07F 17/3251 |
| 2020/0089293 | A1 * | 3/2020 | Enright | H05K 7/20818 |
| 2021/0059079 | A1 * | 2/2021 | Keehn | H05K 7/208 |
| 2023/0032562 | A1 * | 2/2023 | Sweeney | H05K 7/20272 |
| 2023/0156961 | A1 * | 5/2023 | Yuan | H05K 7/203 |
| | | | | 361/700 |
| 2023/0322528 | A1 * | 10/2023 | Chiu | B66C 17/04 |
| | | | | 212/294 |

* cited by examiner

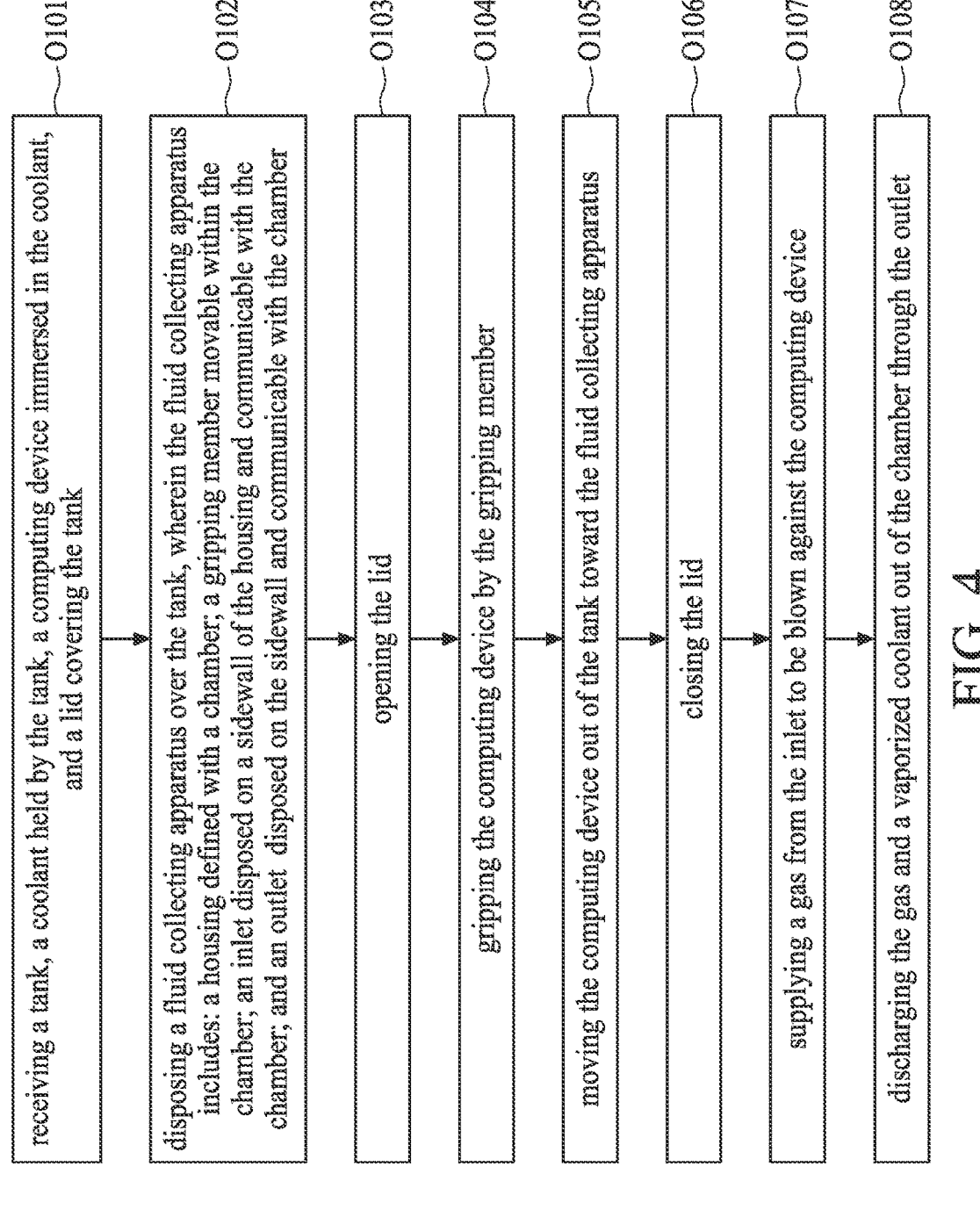

M10

O101 — receiving a tank, a coolant held by the tank, a computing device immersed in the coolant, and a lid covering the tank O102 — disposing a fluid collecting apparatus over the tank, wherein the fluid collecting apparatus includes: a housing defined with a chamber; a gripping member movable within the chamber; an inlet disposed on a sidewall of the housing and communicable with the chamber; and an outlet disposed on the sidewall and communicable with the chamber O103 — opening the lid O104 — gripping the computing device by the gripping member O105 — moving the computing device out of the tank toward the fluid collecting apparatus O106 — closing the lid O107 — supplying a gas from the inlet to be blown against the computing device O108 — discharging the gas and a vaporized coolant out of the chamber through the outlet

FIG. 4

FLUID COLLECTING APPARATUS, COOLING SYSTEM AND METHOD OF OPERATING THE SAME

PRIORITY CLAIM AND CROSS-REFERENCE

This application is a divisional application of non-provisional application Ser. No. 17/214,058 filed on Mar. 26, 2021, entitled "FLUID COLLECTING APPARATUS, COOLING SYSTEM AND METHOD OF OPERATING THE SAME," the disclosure of which is hereby incorporated by reference in its entirety.

BACKGROUND

Computing devices and other electronic components generate heat during use. The heat may be drawn away from the computing device by a dissipating unit such as heat sink, heat spreader, etc. or by air towards the surroundings. However, such traditional cooling methods may not be able to direct heat away from the computing devices effectively and efficiently.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 4 is a flowchart of a method of operating a cooling system in accordance with some embodiments of the present disclosure.

DETAILED DESCRIPTION

Figure 1:
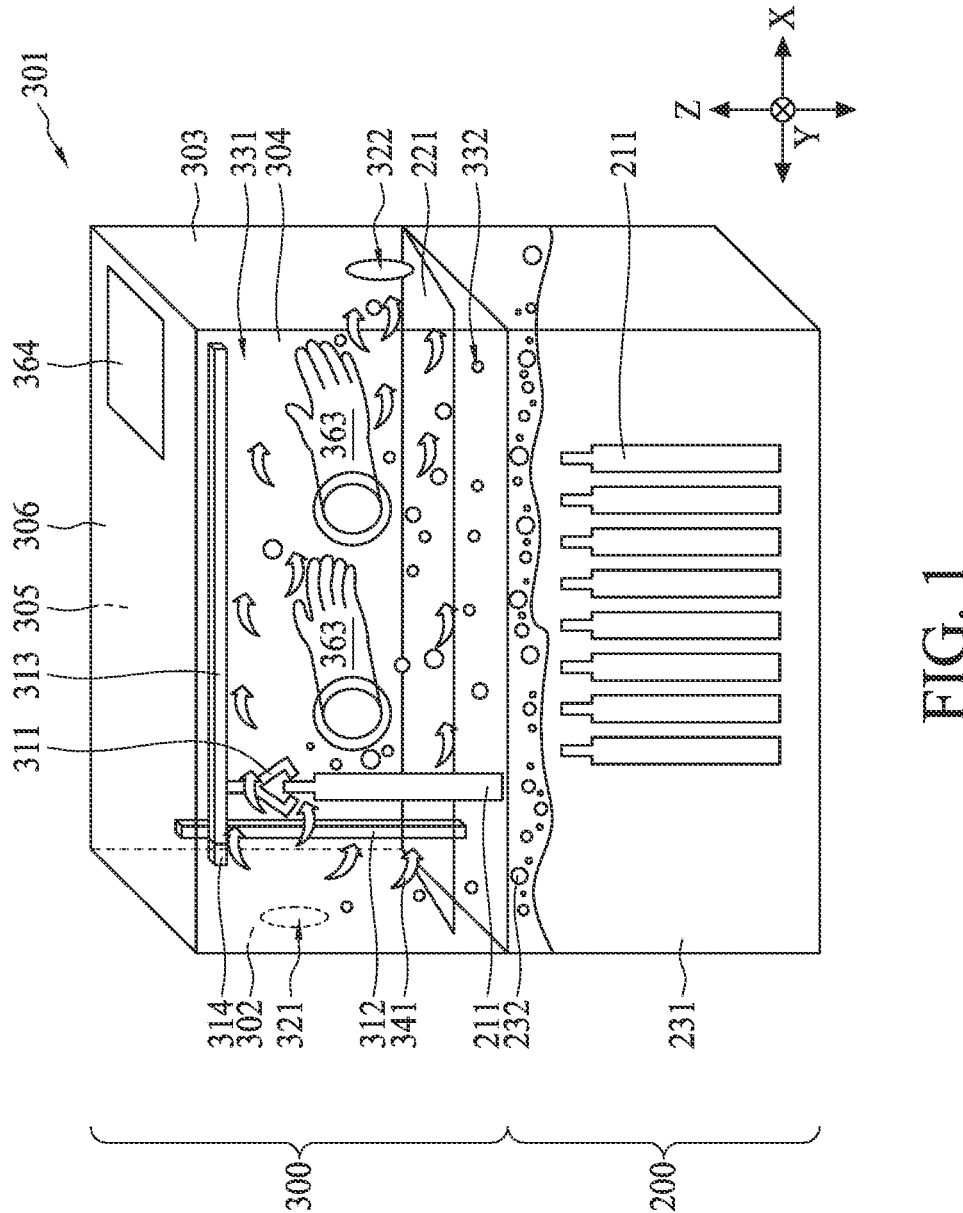
FIG. 1 is a schematic view of a cooling system including a fluid collecting apparatus in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In the present disclosure, a fluid collecting apparatus, a cooling system and a method of operating the cooling system are provided. In particular, the fluid collecting apparatus, including a housing, a gripping member, an inlet and an outlet, is described below. The cooling system, including the fluid collecting apparatus and a tank configured to hold a coolant and a computing device therein, is also provided below. In addition, a method of operating the cooling system is also provided below. Other features and processes may also be included.

The cooling system provided according to some embodiments of the present disclosure includes an immersion cooling system. In some embodiments, the immersion cooling system includes a tank, a liquid coolant in the tank, and computing devices immersed in the coolant. As the computing devices heat up, heat is transferred to the liquid coolant surrounding the computing devices, and the coolant is steadily vaporized and boiled off. When the liquid coolant reaches its boiling point, it shifts from a liquid state into a gaseous state and rises out of the liquid coolant bath. The vapor of the coolant escapes when the tank is open.

In some existing immersion cooling systems, liquid coolant must be constantly added to the tank. Failure to add the coolant to the tank may result in the level of the coolant in the tank dropping and the computing device being exposed to the gaseous atmosphere and not adequately cooled. This could result in a decreased performance or damage to the computing device. In the present disclosure, in some embodiments, a vaporized coolant is discharged out of the housing through an outlet of the fluid collecting apparatus disposed on the tank, and the vaporized coolant may be collected.

FIG. 1 is a schematic view of a cooling system 100 including a tank 200 and a fluid collecting apparatus 300 disposed over the tank 200 according to aspects of the present disclosure in some embodiments. In some embodiments, referring to FIG. 1, the tank 200 is configured to hold a coolant 231 and a computing device 211 therein, and the tank 200 includes a lid 221 configured to cover the tank 200.

In some embodiments, the tank 200 holds the coolant 231, in a liquid state, and some vaporized coolant 232. The vaporized coolant 232 is above the coolant 231. In some embodiments, the tank 200 includes a two-state immersing system. A size, a material and a configuration of the tank 200 are not particularly limited, and may be adjusted according to actual needs. In some embodiments, the configuration of the tank 200 may be adjusted in order to increase efficiency of cooling the computing device 211 and condensing the vaporized coolant 232. In some embodiments, the tank 200 has a rectangle or a square shape from a top view.

In some embodiments, a level of the coolant 231 may be maintained above a height of the computing devices 211 therein. In some embodiments, a plurality of the computing devices 211 are immersed in the coolant 231. In some embodiments, the vaporized coolant 232 above the coolant 231 includes a saturated coolant vapor and a less dense coolant vapor above the saturated coolant vapor. A number of the computing devices 211 is not particularly limited, and may be adjusted according to the configuration of the tank 200.

In some embodiments, the lid 221 is disposed over the tank 200. In some embodiments, the lid 221 covers the coolant 231, the vaporized coolant 232 and the computing devices 211. As the computing device 211 heats up, heat is transferred to the coolant 231 surrounding the computing devices 211, and the coolant 231 is steadily vaporized. The vaporized coolant 232 then rises out of the coolant 231 and rises to the top of the tank 200 proximal to the lid 221. In some embodiments, the vaporized coolant 232 is then cooled and condensed back to the coolant 231, and the heating and the cooling of the coolant 231 from a liquid state to a vapor state and back to the liquid state can create a convection current in the tank 200 while the lid 221 covers the tank 200. In some embodiments, the lid 221 prevents escape of the vaporized coolant 232. In some embodiments, the lid 221 is disposed between the tank 200 and the fluid collecting apparatus 300.

In some embodiments, a ratio of a liquid volume of the coolant 231 to a gaseous volume of the vaporized coolant 232 helps create a convective current and directs the vaporized coolant 232 back into the coolant 231. In some embodiments, the tank 200 is configured to maintain a ratio of the liquid volume of the coolant 231 to the gaseous volume of the vaporized coolant 232 during operation of the cooling system 100. In some embodiments, the ratio is between about 1:4 and about 1:20. In some embodiments, a cooling component (not shown) is disposed in the tank 200 and configured to condense the vaporized coolant 232 back into the coolant 231. In some embodiments, the cooling component is in contact with the vaporized coolant 232. In some embodiments, the cooling component is disposed adjacent to the lid 221. Examples of the cooling component may include, for example, a condenser or a condensing coil.

In some embodiments, the tank 200 is configured to keep the coolant 231 free of dust, water, and/or other contamination. As the computing devices 211 are in direct contact with the coolant 231, minor contaminants can result in short circuits or damage to the computing devices 211. Further, dust, water, water vapor and/or other contamination may contaminate the coolant 231, and thus can degrade properties, including but not limited to the dielectric strength, of the coolant 231 as it becomes contaminated. If the dielectric strength of the coolant 231 is reduced, the computing devices 211 immersed therein may short circuit or be otherwise damaged while in operation. One manner of reducing contamination is to operate the cooling system 100 in an enclosure.

In some embodiments, the coolant 231 is thermally conductive, but substantially electrically non-conductive. In some embodiments, the coolant 231 is dielectric fluid such as deionized water, oil or etc. In some embodiments, the coolant 231 has a boiling point equal to a desired operating temperature of the cooled computing devices 211. In some embodiments, the boiling point of the coolant 231 at standard atmospheric pressure is less than about 100° C. In some embodiments, the boiling point of the coolant 231 at standard atmospheric pressure is less than about 60° C.

In some embodiments, the computing devices 211 are made of materials that are not soluble and do not otherwise break down within the tank 200 when in contact with the coolant 231. In some embodiments, the computing devices 211 is a printed circuit board (PCB), server board or the like. In some embodiments, the computing devices 211 are submerged within the coolant 231 in liquid state. In some embodiments, at least a portion of each of the computing devices 211 is in contact with the coolant 231, and the computing devices 211 are cooled by both the coolant 231 and the vaporized coolant 232.

Figure 2:
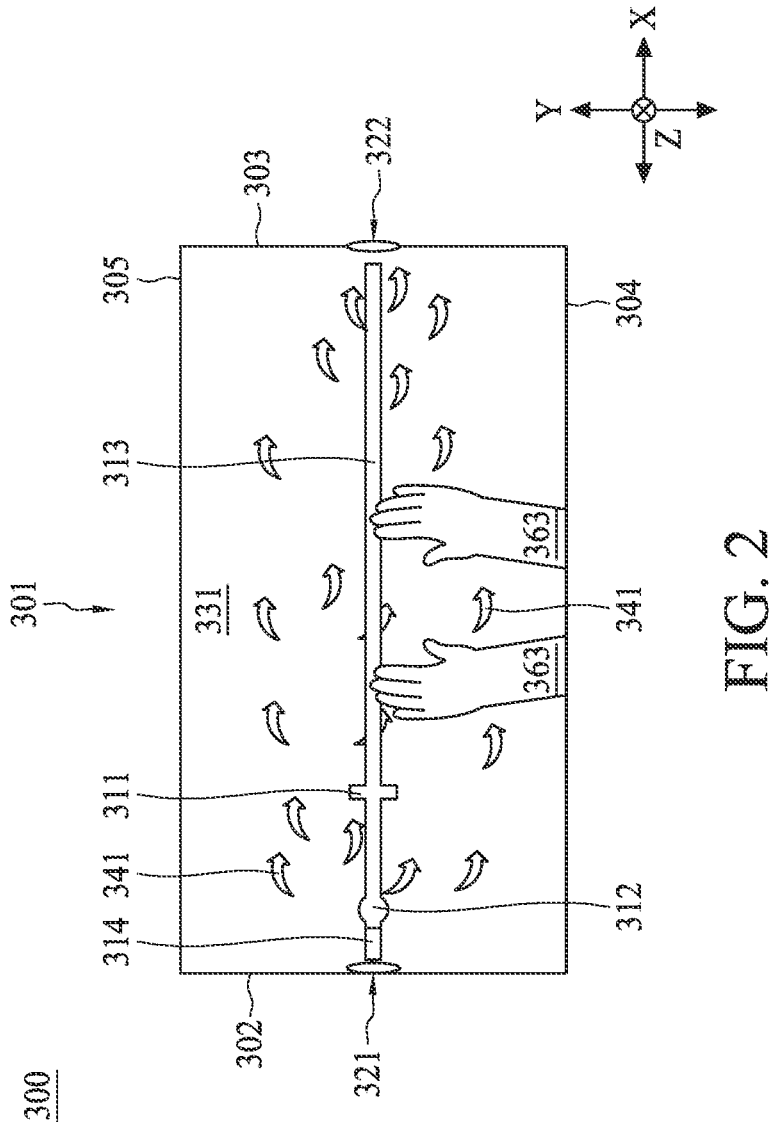
FIG. 2 is a schematic top view of a fluid collecting apparatus according to aspects of the present disclosure in some embodiments.

FIG. 2 is a schematic top view of a fluid collecting apparatus according to aspects of the present disclosure in some embodiments. In some embodiments, referring to FIGS. 1 and 2, the fluid collecting apparatus 300 is in contact with the tank 200. In some embodiments, the fluid collecting apparatus 300 and the tank 200 overlap from a top view. In some embodiments, the fluid collecting apparatus 300 can be separated from the tank 200.

In some embodiments, the fluid collecting apparatus 300 includes a housing 301, a gripping member 311, an inlet 321 and an outlet 322. The housing 301 defines a chamber 331. In some embodiments, the fluid collecting apparatus 300 is configured to keep the coolant 231 and the vaporized coolant 232 in the cooling system 100, and helps minimize loss of the coolant 231 while the tank 200 or the cooling system 100 is opened to provide access to the computing device 211 therein. In some embodiments, a dimension of the tank 200 is substantially same as a dimension of the housing 301. In some embodiments, the configuration of the housing 301 may be adjusted in order to increase efficiency of vaporization of the coolant 231 in the chamber 331. In some embodiments, the tank 200 has a length of about 1500 mm to about 2000 mm. In some embodiments, the tank 200 has a width of about 500 mm to about 1000 mm. In some embodiments, the tank 200 has a height of about 1000 mm to about 1500 mm. In some embodiments, the tank 200 has a volume of about 2 m³ to about 2.5 m³.

In some embodiments, the housing 301 includes a first sidewall 302, a second sidewall 303 opposite to the first sidewall 302, and an opening 332 for accessing the chamber 331. In some embodiments, the chamber 331 is surrounded by the first sidewall 302 and the second sidewall 303. In some embodiments, the housing 301 further includes a third sidewall 304 and a fourth sidewall 305 opposite to the third sidewall 304, and the third sidewall 304 and the fourth sidewall 305 are disposed between the first sidewall 302 and the second sidewall 303. In some embodiments, the chamber 331 is surrounded by the first sidewall 302, the second sidewall 303, the third sidewall 304, and the fourth sidewall 305. In some embodiments, the chamber 331 has a square or rectangular shape in a top view.

In some embodiments, the housing 301 further includes a top wall 306 disposed over the first sidewall 302 and the second sidewall 303. In some embodiments, the top wall 306 is opposite to the opening 332. In some embodiments, the lid 221 is disposed at the opening 332 and configured to open or close the chamber 331. In some embodiments, a dimension of the lid 221 is substantially same as a dimension of the opening 332. In some embodiments, the chamber 331 is sealed when the lid 221 is closed. In some embodiments, the chamber 331 is opened when the lid 221 is opened, and the coolant 231, the vaporized coolant 232 and the computing devices 211 may be moved into or out of the chamber 331.

In some embodiments, the gripping member 311 is movable within the chamber 331. Embodiments of the gripping member 311 allow for movement of a specific computing device 211, such as a failed computing device, without interruption of any other computing devices 211. In some embodiments, the specific computing device 211 may be removed from the tank 200 by the gripping member 311. In some embodiments, the specific computing device 211 can be drawn out from the coolant 231 or immersed into the coolant 231 by the gripping member 311. In some embodiments, the gripping member 311 is configured to hold the computing device 211 in the chamber 331 without damaging the computing device 211. In some embodiments, the gripping member 311 is extendable toward or retractable away from the opening 332. In some embodiments, the gripping member 311 is configured to remove, replace and install the computing device 211 in the tank 200. In some embodiments, the gripping member 311 is extendable to load the computing device 211 into the tank 200 or retractable to remove the computing device 211 from the tank 200. In some embodiments, the gripping member 311 includes a clamp to hold the computing device 211.

In some embodiments, the gripping member 311 is arranged to travel along a first direction X, and/or a second direction Y (e.g. left or right), and/or a third direction Z (e.g. upward or downward) in order to remove and/or install the computing device 211 in the cooling system 100. The second direction Y is substantially orthogonal to the first direction X, and the third direction Z is substantially orthogonal to the first direction X and the second direction Y. In some embodiments, the gripping member 311 is movable along a first rail 312 or a second rail 313 substantially orthogonal to the first rail 312.

In some embodiments, the first rail 312 is disposed adjacent to the first sidewall 302 and extends along the third direction Z from the lid 221 to the top wall 306. In some embodiments, a distance between the first rail 312 and the first sidewall 302 is less than a distance between the first rail 312 and the second sidewall 303. In some embodiments, a distance between the first rail 312 and the third sidewall 304 is substantially equal to a distance between the first rail 312 and the fourth sidewall 305. In some embodiments, the first rail 312 is movable along the second direction Y.

In some embodiments, the second rail 313 extends along the first direction X from the first sidewall 302 to the second sidewall 303. In some embodiments, one end of the second rail 313 is slidably attached to the first rail 312, and the second rail 313 is movable along the first rail 312 in the third direction Z.

In some embodiments, the gripping member 311 is slidably attached to the second rail 313 and can be moved along the second rail 313 in the first direction X. In some embodiments, the second rail 313 includes an actuating motor 314 disposed at the end of the second rail 313, wherein the actuating motor 314 is configured to control movement of the second rail 313 along the first rail 312.

In some embodiments, the inlet 321 and the outlet 322 are disposed on the housing 301 and in communication with the chamber 331. In some embodiments, the inlet 321 and the outlet 322 are holes. In some embodiments, the inlet 321 is configured to deliver a gas 341 into the chamber 331, and the outlet 322 is configured to discharge the gas 341 out of the chamber 331. Locations, shapes and numbers of the inlet 321 and the outlet 322 are not particularly limited, and may be adjusted depending on requirements. In some embodiments, the inlet 321 is disposed at a level substantially higher than the outlet 322. In some embodiments, the inlet 321 is distal to the outlet 322. In some embodiments, the inlet 321 is disposed on the first sidewall 302 and communicable with the chamber 331. In some embodiments, the outlet 322 is disposed on the second sidewall 303 and communicable with the chamber 331. In some embodiments, the inlet 321 is disposed on the third sidewall 304 or the fourth sidewall 305, and the outlet 322 is disposed on the second sidewall 303. In some embodiments, the inlet 321 is disposed on the first sidewall 302, and the outlet 322 is disposed on the third sidewall 304 or the fourth sidewall 305. In some embodiments, the inlet 321 is disposed on the third sidewall 304, and the outlet 322 is disposed on the fourth sidewall 305.

In some embodiments, the gas 341 is configured to dry the computing device 211 in the chamber 331. The computing device 211 from the tank 200 may have some coolant 231 thereon. In some embodiments, the gas 341 is configured to remove the coolant 231 from the computing device 211. In some embodiments, the gas 341 is configured to vaporize the coolant 231 in the chamber 331. In some embodiments, the gas 341 is delivered into the chamber 331 and is blown in a direction from the inlet 321 toward the outlet 322. In some embodiments, the gas 341 is blown into the chamber 331 through the inlet 321, and is discharged out of the chamber 331 through the outlet 322. In some embodiments, the gas 341 is blown against the computing device 211 at a velocity between about 2 m/s and about 5 m/s.

In some embodiments, a glove 363 is arranged on the housing 301 and configured to access the chamber 331. In some embodiments, the glove 363 is arranged on the third sidewall 304 of the housing 301. In some embodiments, the glove 363 is configured to manually control the fluid collecting apparatus 300. In some embodiments, a user may use the glove 363 to access and adjust the computing device 211 held by the gripping member 311. In some embodiments, the fluid collecting apparatus 300 includes a glove box.

Figure 3:
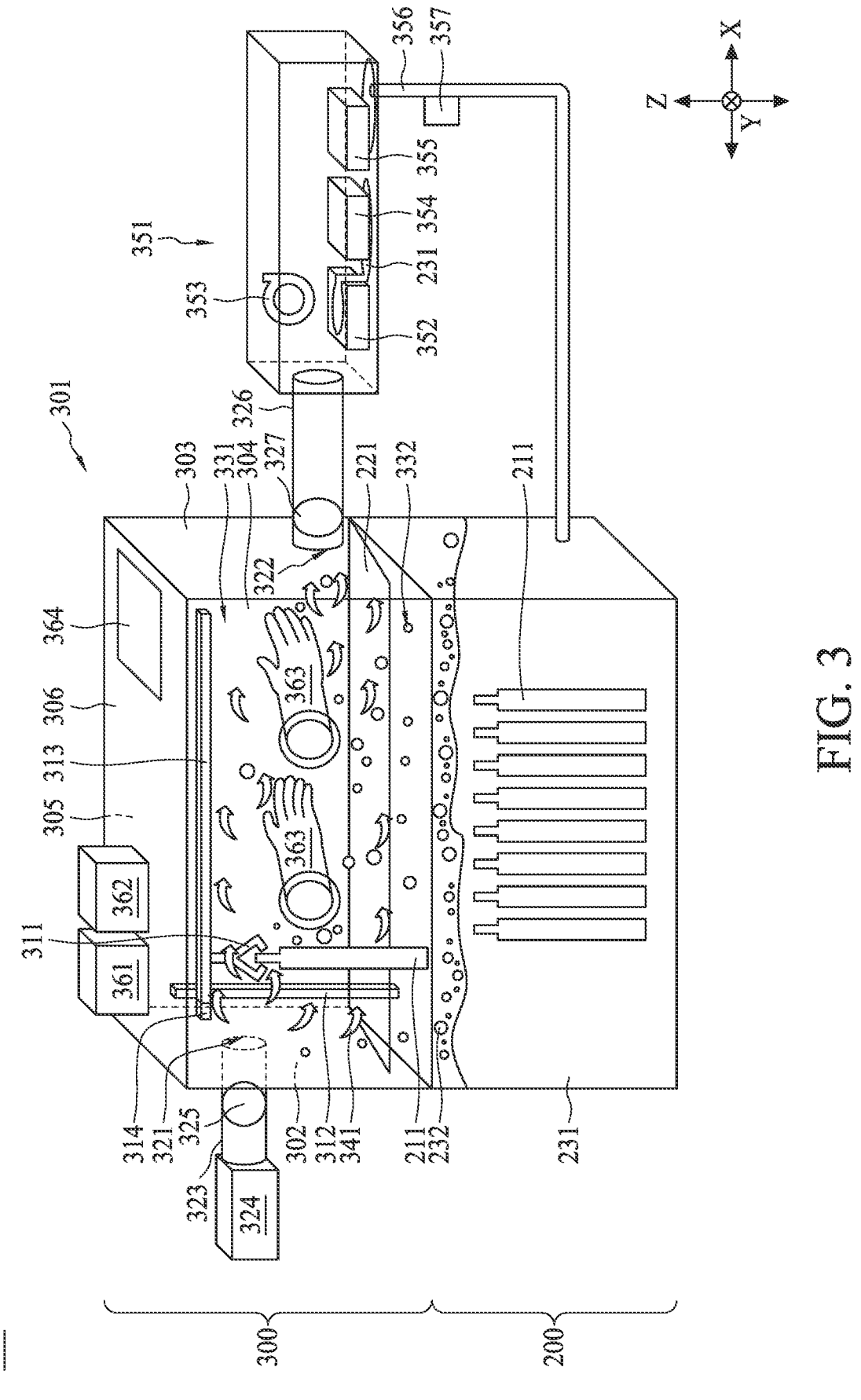
FIG. 3 is a schematic view of a cooling system including a fluid collecting apparatus in accordance with some embodiments of the present disclosure.

FIG. 3 is a schematic view of a cooling system 400 including a tank 200 and a fluid collecting apparatus 300 disposed over the tank 200 according to aspects of the present disclosure in some embodiments. In some embodiments, referring to FIG. 3, one end of a first gas conduit 323 is coupled to the inlet 321, and the other end of the first gas conduit 323 is coupled to a gas source 324. The first gas conduit 323 is configured to deliver the gas 341 into the chamber 331. In some embodiments, the gas source 324 is configured to supply the gas 341, in which a suitable gas may be supplied depending on requirements; for example, the gas may be air, nitrogen, inert gas, etc., but the present invention is not limited thereto. In some embodiments, the gas 341 is supplied by the gas source 324 and is delivered into the chamber 331 through the inlet 321. In some embodiments, a temperature of the gas 341 is substantially higher than a boiling point of the coolant 231. In some embodiments, the gas 341 is hot air. In some embodiments, the gas 341 is substantially higher than 50° C. In some embodiments, a temperature of the chamber 331 is substantially higher than 50° C.

In some embodiments, a first valve 325 is disposed at the inlet 321 and is configured to control whether the gas 341 enters the chamber 331 through the inlet 321. In some embodiments, the first valve 325 is disposed at the first gas conduit 323 and is configured to control whether the gas 341 enters the chamber 331 through the first gas conduit 323 and the inlet 321.

In some embodiments, one end of a second gas conduit 326 is coupled to the outlet 322, and another end of the second gas conduit 326 is in communication with a space having a pressure equal to or lower than a pressure of the chamber 331; for example, an external environment or a negative pressure space; however, the present invention is not limited thereto. In some embodiments, the second gas conduit 326 is configured to discharge the gas 341, the vaporized coolant 232 and/or a fluid (not shown) out of the chamber 331. In some embodiments, the fluid includes the coolant 231. In some embodiments, the another end of the second gas conduit 326 is connected to a blower, pump or the like to draw the gas 341 out of the chamber 331 through the outlet 322.

In some embodiments, a second valve 327 disposed at the outlet 322 is configured to control whether the gas 341, the vaporized coolant 232 and/or the fluid exit the chamber 331 through the outlet 322. In some embodiments, the second valve 327 is disposed at the second gas conduit 326 and is configured to control whether the gas 341, the vaporized coolant 232 and/or the fluid from the chamber 331 are discharged via the outlet 322 and the second gas conduit 326.

In some embodiments, the other end the second gas conduit 326 is coupled to a collector 351. In some embodiments, the collector 351 is disposed adjacent to the outlet 322 and configured to collect the gas 341, the vaporized coolant 232 and/or the fluid from the chamber 331. In some embodiments, the coolant 231 vaporized in the chamber 331 is collected by the collector 351 through the outlet 322 and the second gas conduit 326. In some embodiments, the gas 341 blows the coolant 231, the vaporized coolant 232 and/or the fluid in the chamber 331 to the outlet 322, and the coolant 231, the vaporized coolant 232 and/or the fluid reach the collector 351 through the second gas conduit 326. In some embodiments, the collector 351 is a mobile recycle tank.

In some embodiments, a condenser 352 is disposed adjacent to the outlet 322 and configured to condense the vaporized coolant 232 from the chamber 331 into the coolant 231 in liquid state. In some embodiments, the coolant 231 in the collector 351 is condensed by the condenser 352. In some embodiments, the condenser 352 is disposed in the collector 351. In some embodiments, the shape and geometry of the condenser 352 encourage the flow of the vaporized coolant 232 from the chamber 331 toward the condenser 352. The coolant 231 condensed by the condenser 352 circulates in the cooling system 400 through the fluid collecting apparatus 300. In some embodiments, the coolant 231 condensed by the condenser 352 is delivered from the collector 351 back to the tank 200 by a pump 357 or the like in order to recycle the vaporized coolant 232 after the condensation.

In some embodiments, a blower 353 is disposed in the collector 351. In some embodiments, a separator 354 is disposed adjacent to the condenser 352 and configured to separate the coolant 231 from the fluid. In some embodiments, a purifier 355 is disposed adjacent to the condenser 352 and configured to purify the coolant 231 collected by the collector 351. In some embodiments, the separator 354 and the purifier 355 are disposed in the collector 351. In some embodiments, a refill unit 356 connects the collector 351 to the tank 200 and is configured to deliver the coolant 231 condensed by the condenser 352 back to the tank 200.

In some embodiments, the cooling system 400 further includes a control system 361. The control system 361 is configured to control the tank 200 and the fluid collecting apparatus 300. In some embodiments, a sensing unit 362 provides the information regarding the tank 200 and the fluid collecting apparatus 300 to the control system 361, and the control system 361 adjusts the fluid collecting apparatus 300 in accordance with the information.

In some embodiments, the control system 361 adjusts the condition in which the gas 341 enters or exits the chamber 331 in real time, in accordance with the information provided by the sensing unit 362. In some embodiments, the control system 361 controls the moving condition of the gripping member 311 and the gas 341 supply condition of the gas source 324. In some embodiments, the control system 361 controls the opening of the lid 221, the temperature of the gas 341, and a condition and a position of the computing device 211. In some embodiments, the control system 361 is electrically connected to the first valve 325, the second valve 327, the lid 221, and/or the gripping member 311.

In some embodiments, the housing 301 includes a door 364 configured to allow the computing device 211 to enter or exit the chamber 331. In some embodiments, the door 364 is disposed on the top wall 306 of the housing 301. In some embodiments, the door 364 is disposed on the first sidewall 302, the second sidewall 303, the third sidewall 304, or the fourth sidewall 305.

FIG. 4 is a flowchart of a method M10 of operating a cooling system in accordance with some embodiments of the present disclosure. The method M10 includes several operations: (O101) receiving a tank, a coolant held by the tank, a computing device immersed in the coolant, and a lid covering the tank; and (O102) disposing a fluid collecting apparatus over the tank, wherein the fluid collecting apparatus includes a housing defined with a chamber; a gripping member movable within the chamber; an inlet disposed on a sidewall of the housing and communicable with the chamber; and an outlet disposed on the sidewall and communicable with the chamber. The method M10 further includes several operations: (O103) opening the lid; (O104) gripping the computing device by the gripping member;

(O105) moving the computing device out of the tank toward the fluid collecting apparatus; (O106) closing the lid; (O107) supplying a gas from the inlet to be blown against the computing device; and (O108) discharging the gas and a vaporized coolant out of the chamber through the outlet.

FIGS. 5 to 16 are schematic views of one or more stages of the method of operating a cooling system using the method M10 in accordance with some embodiments of the present disclosure. In some embodiments, the method M10 is configured to form and operate the cooling system 100 as illustrated in FIGS. 1 and 2. In some embodiments, the method M10 is configured to form and operate the cooling system 400 as illustrated in FIG. 3.

Figure 5:
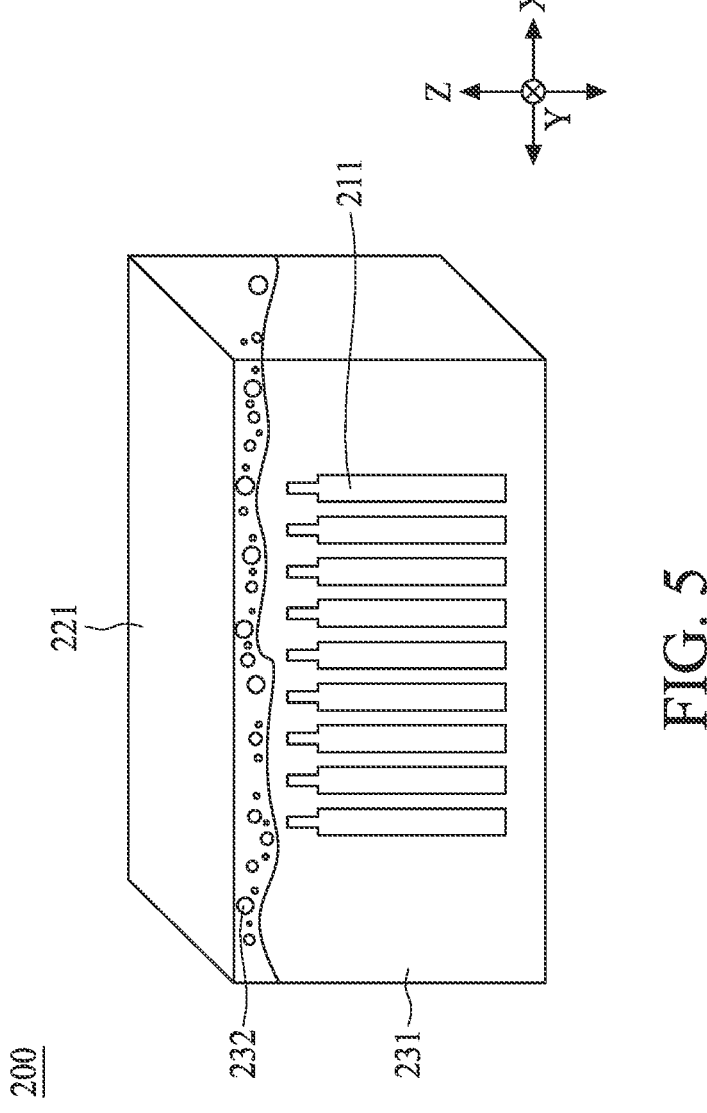
FIGS. 5 to 16 are schematic views of one or more stages of the method of operating a cooling system in accordance with some embodiments of the present disclosure.

Referring to FIG. 5, in operation O101, a tank 200, a coolant 231 held by the tank 200, a computing device 211 immersed in the coolant 231, and a lid 221 covering the tank 200 are received. In some embodiments, a plurality of the computing devices 211 are immersed in the coolant 231. In some embodiments, the coolant 231 in liquid state and some vaporized coolant 232 are held by the tank 200. In some embodiments, the computing device 211 is in operation upon immersing in the coolant 231. In some embodiments, the tank 200 is in a configuration as described above or as shown in FIG. 1.

Figure 6:
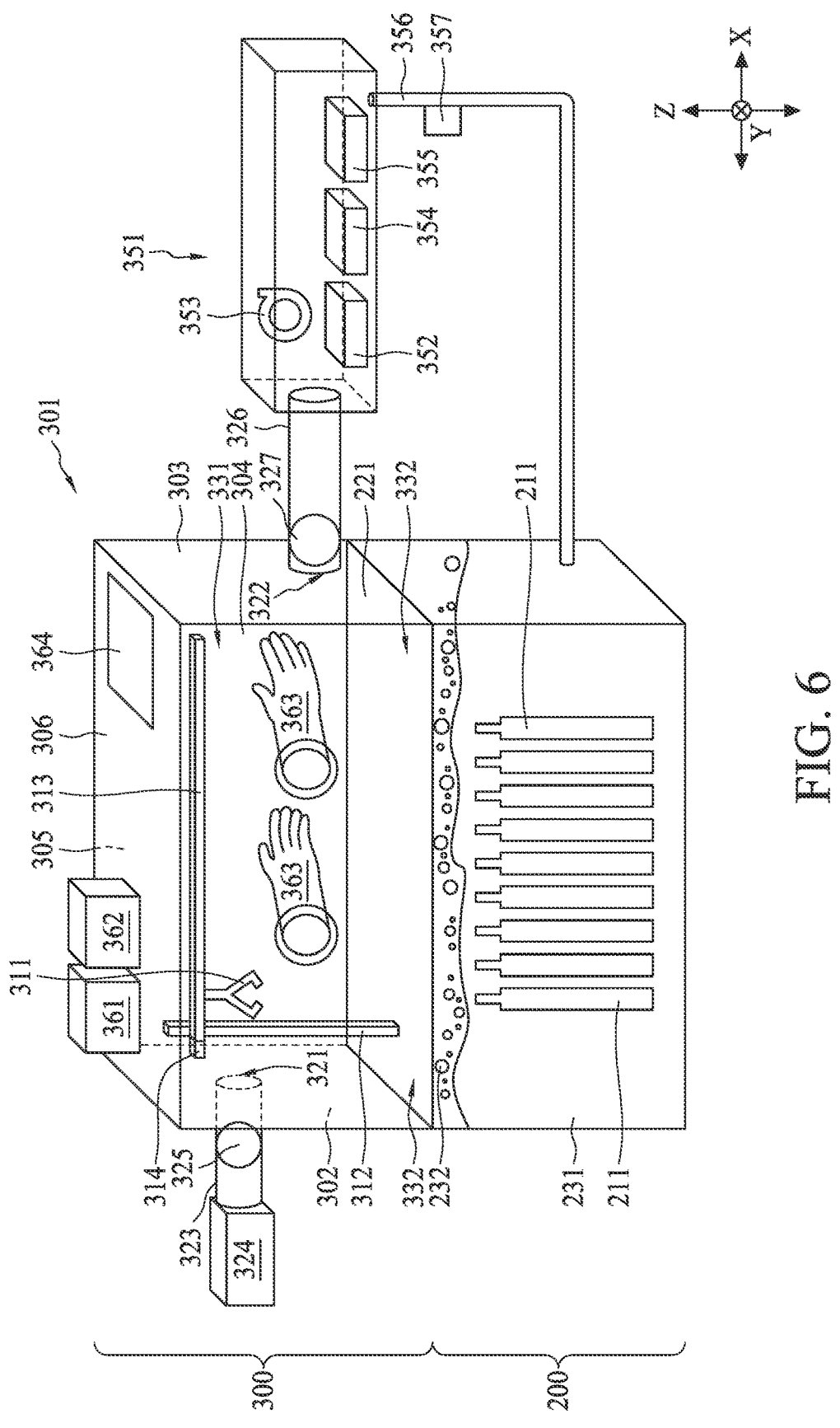

In operation O102, referring to FIG. 6, a fluid collecting apparatus 300 is disposed over the tank 200. The fluid collecting apparatus 300 includes a housing 301 defined with a chamber 331; a gripping member 311 movable within the chamber 331; an inlet 321 disposed on a first sidewall 302 of the housing 301 and communicable with the chamber 331; and an outlet 322 disposed on a second sidewall 303 and communicable with the chamber 331. In some embodiments, an opening 332 for accessing the chamber 331 is covered by the lid 221. In some embodiments, the fluid collecting apparatus 300 is temporarily fixed on the tank 200.

In some embodiments, a temperature of the chamber 331 is substantially higher than a boiling point of the coolant 231. In some embodiments, the temperature of the chamber 331 is substantially higher than 50° C. In some embodiments, the fluid collecting apparatus 300 is in a configuration compatible with the tank 200. In some embodiments, the fluid collecting apparatus 300 is in a configuration as described above or as shown in FIGS. 1 and 2. In some embodiments, the fluid collecting apparatus 300 is in a configuration as described above or as shown in FIG. 3.

Figure 7:
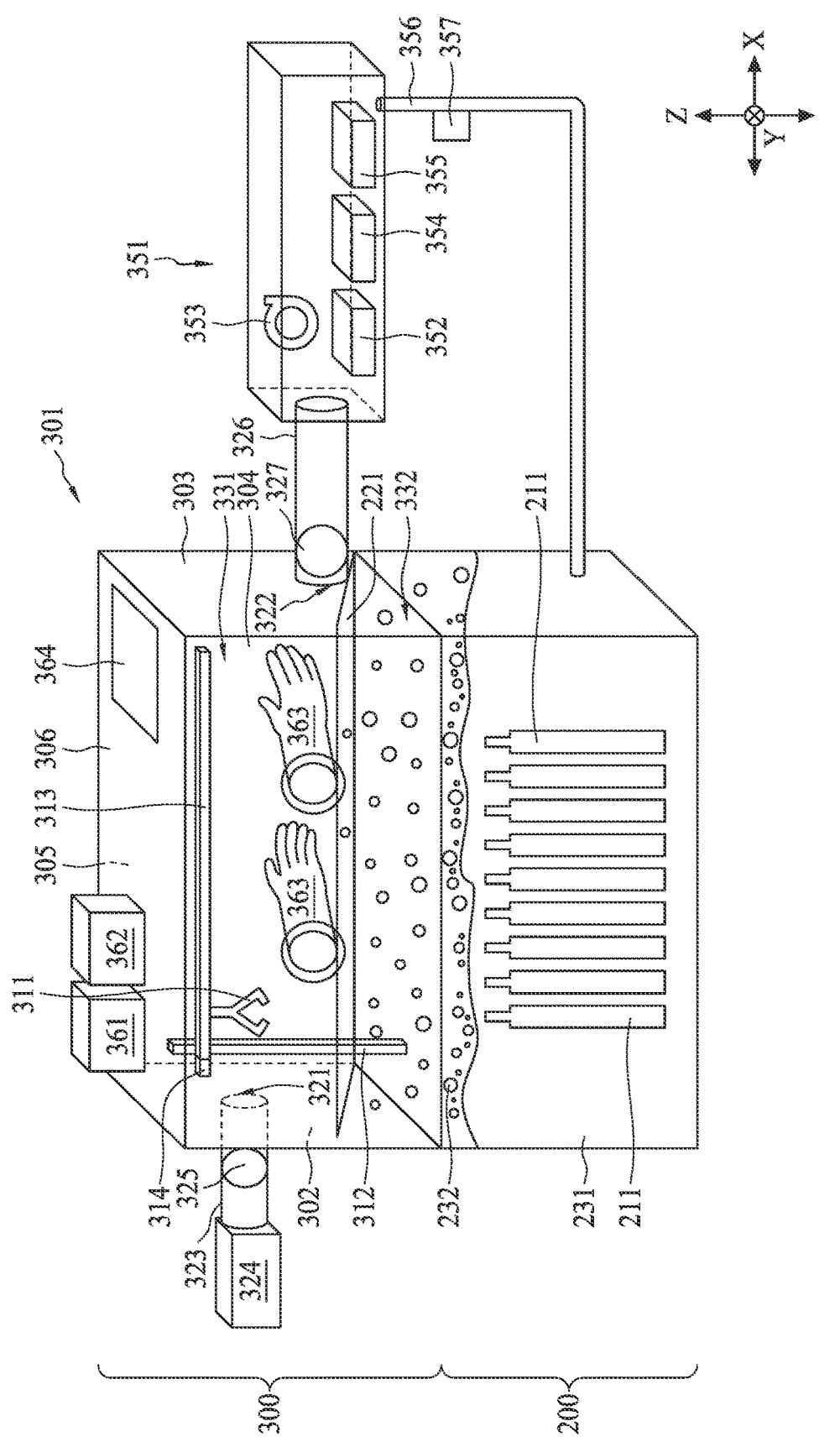

In operation O103, referring to FIG. 7, the lid 221 is opened. In some embodiments, when the lid 221 is opened, the chamber 331 is in communication with the tank 200 through the opening 332. In some embodiments, the lid 221 is opened to allow the gripping member 311 to enter the tank 200. In some embodiments, the lid 221 is opened to allow the computing devices 211 to enter the chamber 331. In some embodiments, some of the vaporized coolant 232 enters the chamber 331 through the opening 332.

Figure 8:
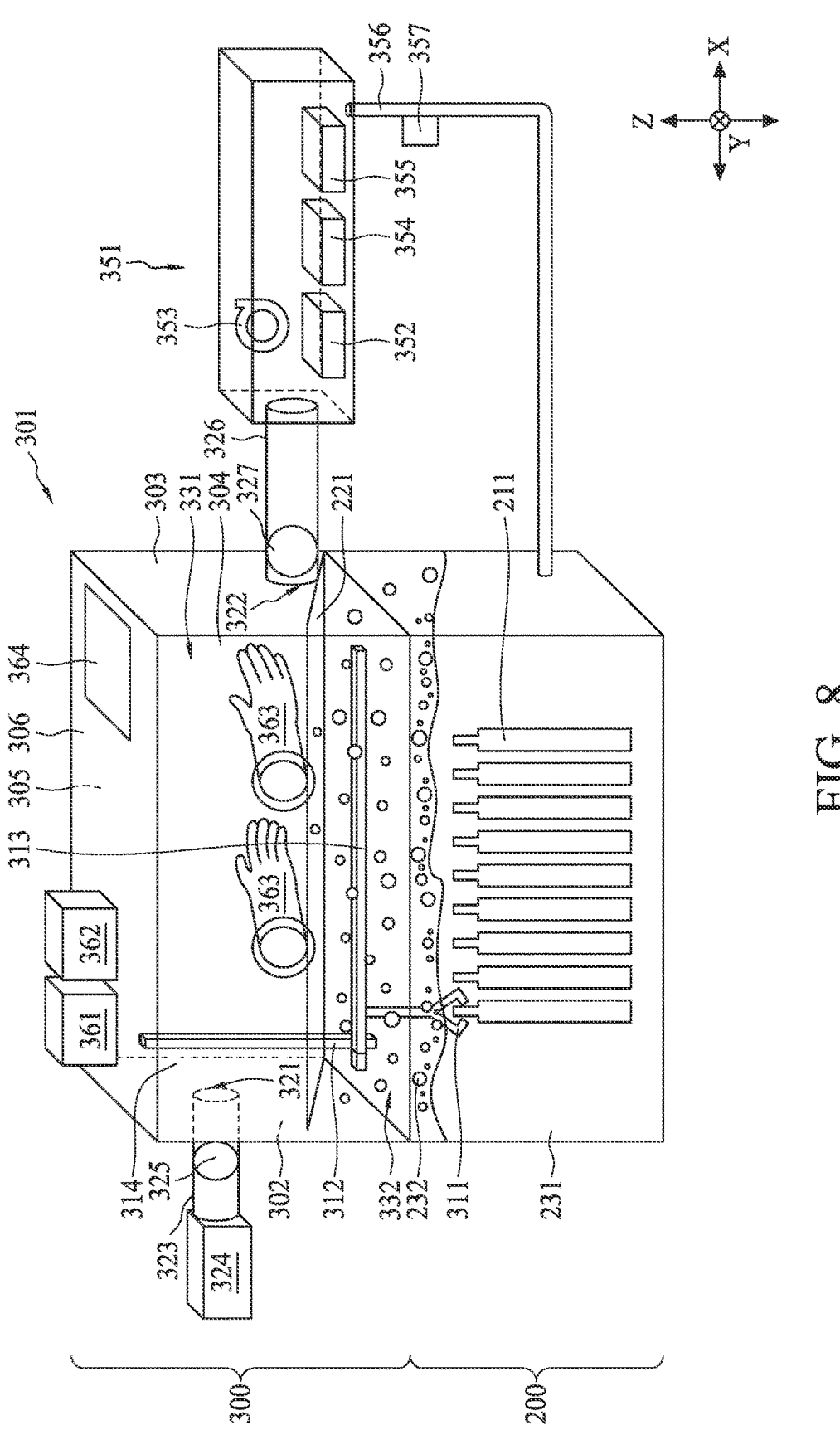

In operation O104, referring to FIG. 8, the gripping member 311 grips the computing device 211. In some embodiments, the gripping member 311 moves through the opening 332 to grip one of the computing devices 211 in the tank 200. In some embodiments, a control system 361 specifies a computing device 211 that is to be gripped by the gripping member 311. In some embodiments, a sensing unit 362 senses the condition of the computing devices 211 in real time, and the control system 361 controls the gripping member 311 to hold the specific computing device 211. In some embodiments, the gripping of the specific computing device 211 does not interrupt other computing devices 211.

In some embodiments, the gripping member 311 extends into the tank 200 to grip the specific computing device 211.

In some embodiments, the gripping member 311 aligns with the specific computing device 211 before moving into the tank 200. In some embodiments, the gripping member 311 slidably attaches to a second rail 313 extending along a first direction X, and one end of the second rail 313 slidably attaches to a first rail 312 extending along a third direction Z. In some embodiments, the first rail 312 is moved along a second direction Y substantially orthogonal to the first direction X and the third direction Z to align with the specific computing device 211 in the second direction Y.

In some embodiments, the gripping member 311 moves along the second rail 313 along the first direction X to align with the specific computing device 211. In some embodiments, the second rail 313 moves along the first rail 312 to move the gripping member 311 along the third direction Z. In some embodiments, the gripping member 311 travels in the first direction X and the second direction Y, and subsequently moves down in the third direction Z to get close to the specific computing device 211. In some embodiments, an actuating motor 314 disposed at the end of the second rail 313 controls movement of the second rail 313 to move along the first rail 312. In some embodiments, the control system 361 controls the movement of the lid 221, the gripping member 311, the first rail 312 and the second rail 313.

Figure 9:
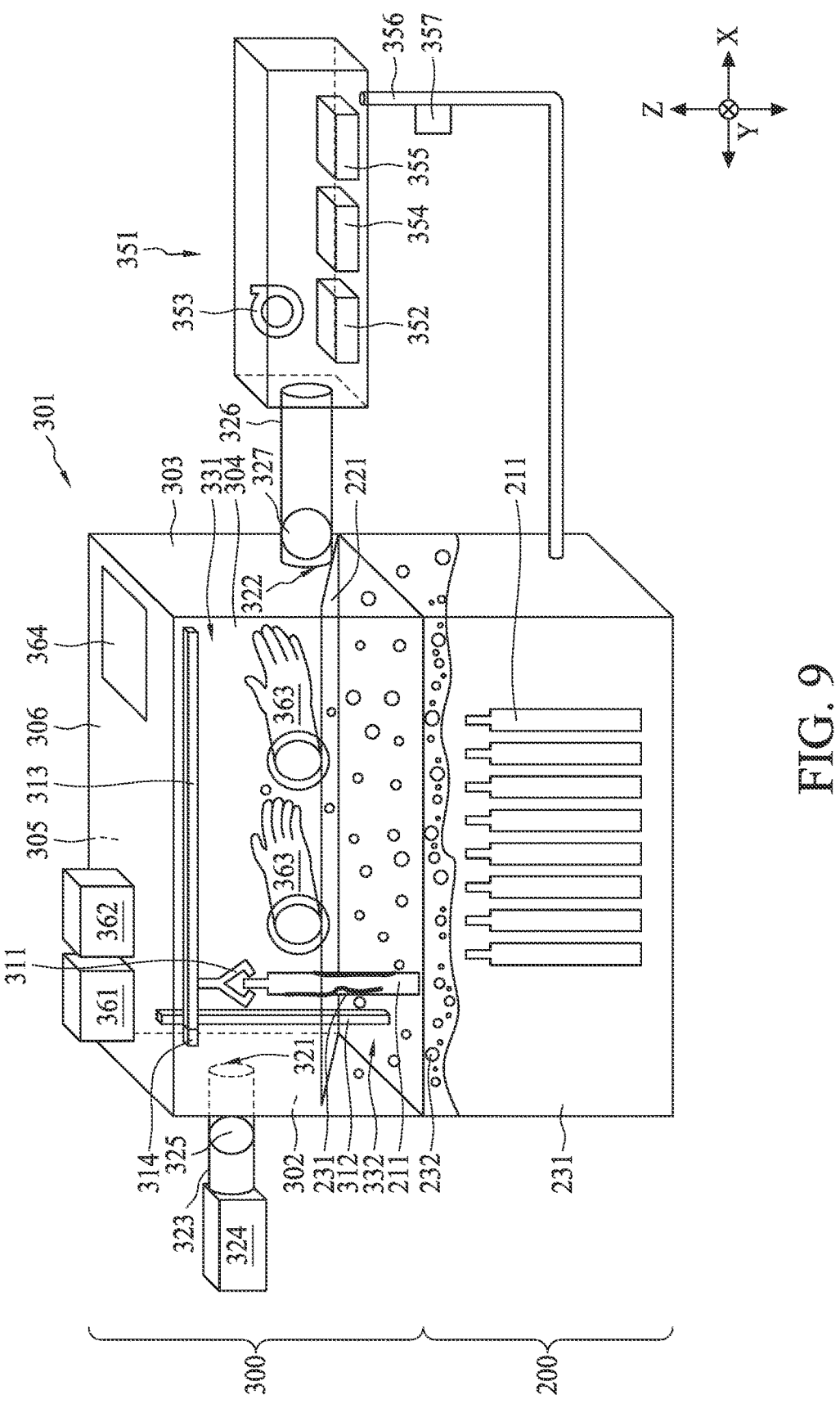

In operation O105, referring to FIG. 9, the computing device 211 is moved out of the tank 200 toward the fluid collecting apparatus 300. In some embodiments, some coolant 231 remains on a surface of the computing device 211. That is, the computing device 211 is wet when taken out of the tank 200.

In some embodiments, the gripping member 311 is retracted to remove the computing device 211 from the tank 200. In some embodiments, the gripping member 311 is retracted to slightly move the computing device 211 along the third direction Z, and the second rail 313 moves along the first rail 312 to move the gripping member 311 and the computing device 211 into the chamber 331.

Figure 10:
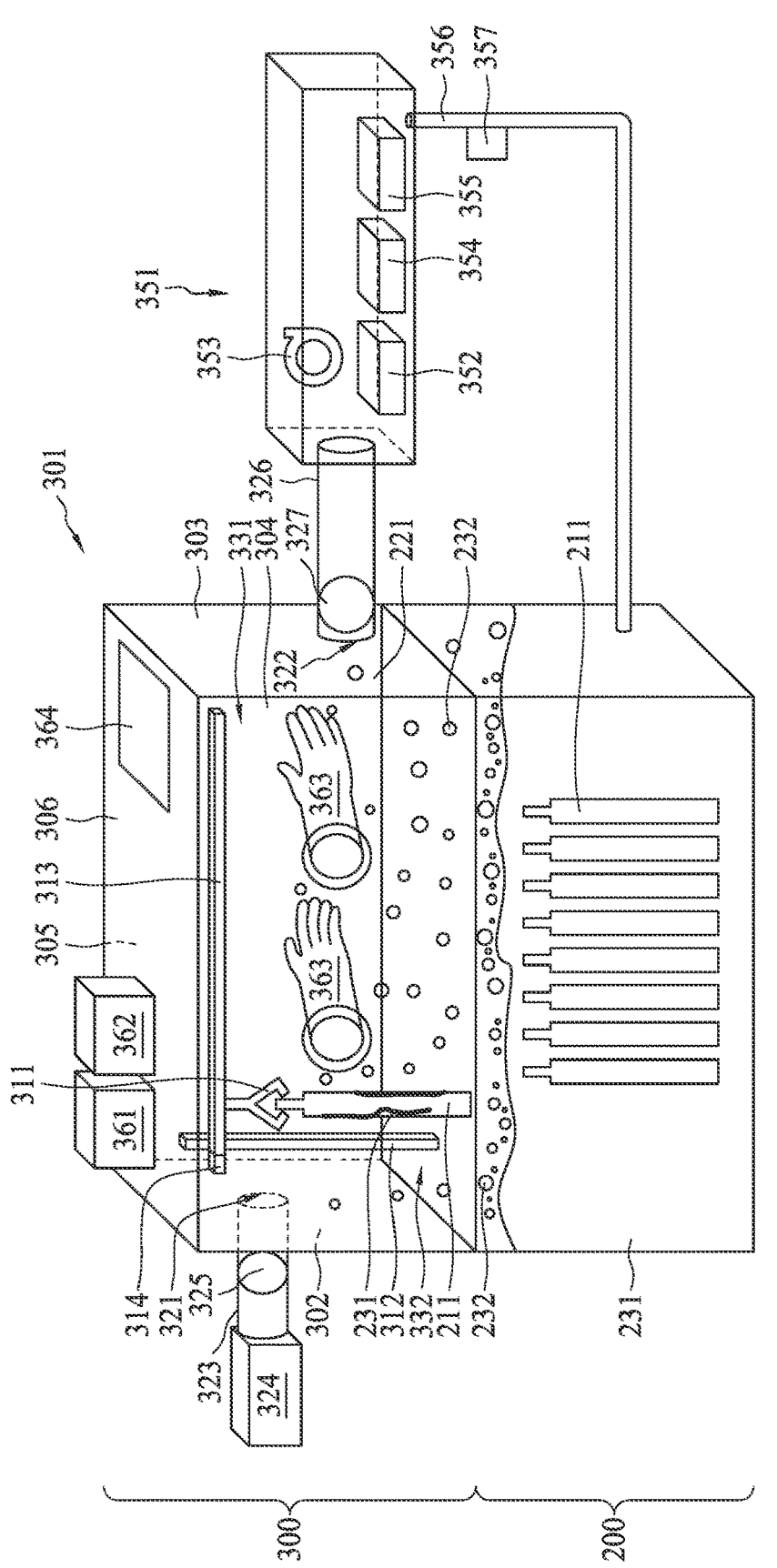

In operation O106, referring to FIG. 10, the lid 221 is closed. In some embodiments, the lid 221 covers the opening 332. In some embodiments, the chamber 331 is sealed after the closing of the lid 221. In some embodiments, the specific computing device 211 in the fluid collecting apparatus 300 is held by the gripping member 311 and the specific computing device 211 has some coolant 231 disposed thereon. In some embodiments, some of the vaporized coolant 232 escaped from the tank 200 is disposed in the chamber 331.

Figure 11:
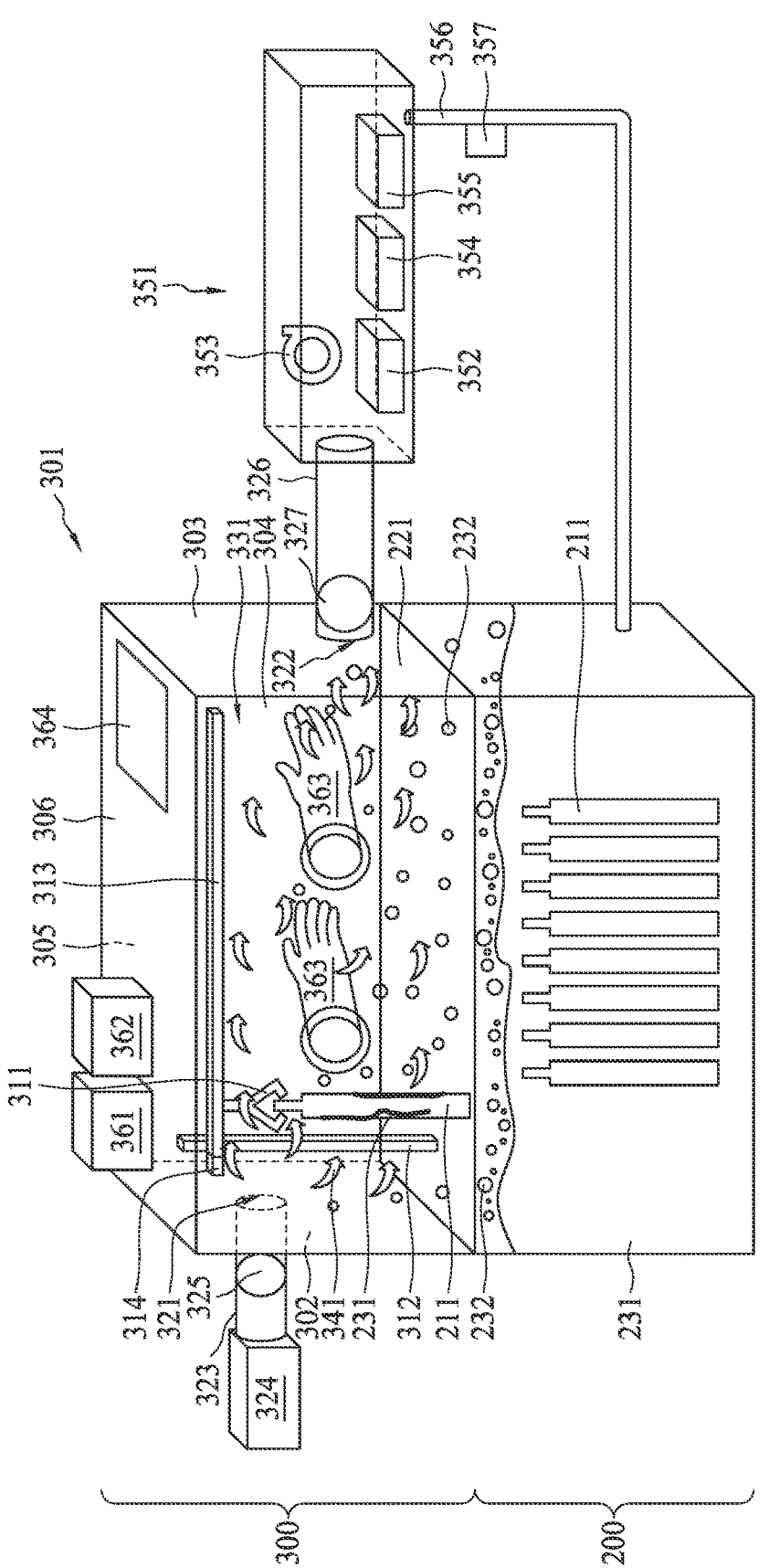

In operation O107, referring to FIG. 11, a gas 341 is supplied from the inlet 321 into the chamber 331 to be blown against the computing device 211. In some embodiments, the gas 341 blows the computing device 211 dry. In some embodiments, the gas 341 vaporizes the coolant 231 in the chamber 331 to form the vaporized coolant 232. In some embodiments, the gas 341 is blown toward the computing device 211 and/or the outlet 322, and the vaporized coolant 232 is moved toward the outlet 322 by the gas 341.

In some embodiments, a duration of the supplying of the gas 341 is between about 5 minutes and about 10 minutes. In some embodiments, the gas 341 is blown against the computing device 211 at a velocity between about 2 m/s and about 5 m/s. In some embodiments, a temperature of the gas 341 is substantially higher than a boiling point of the coolant 231. In some embodiments, the gas 341 makes a temperature of the chamber 331 substantially higher than the boiling point of the coolant 231, such as higher than 50° C.

In some embodiments, the gas 341 is supplied by opening a first valve 325. In some embodiments, the first valve 325 is opened, and the gas 341 provided by a gas source 324 enters the chamber 331 through a first gas conduit 323 and the inlet 321.

Figure 12:
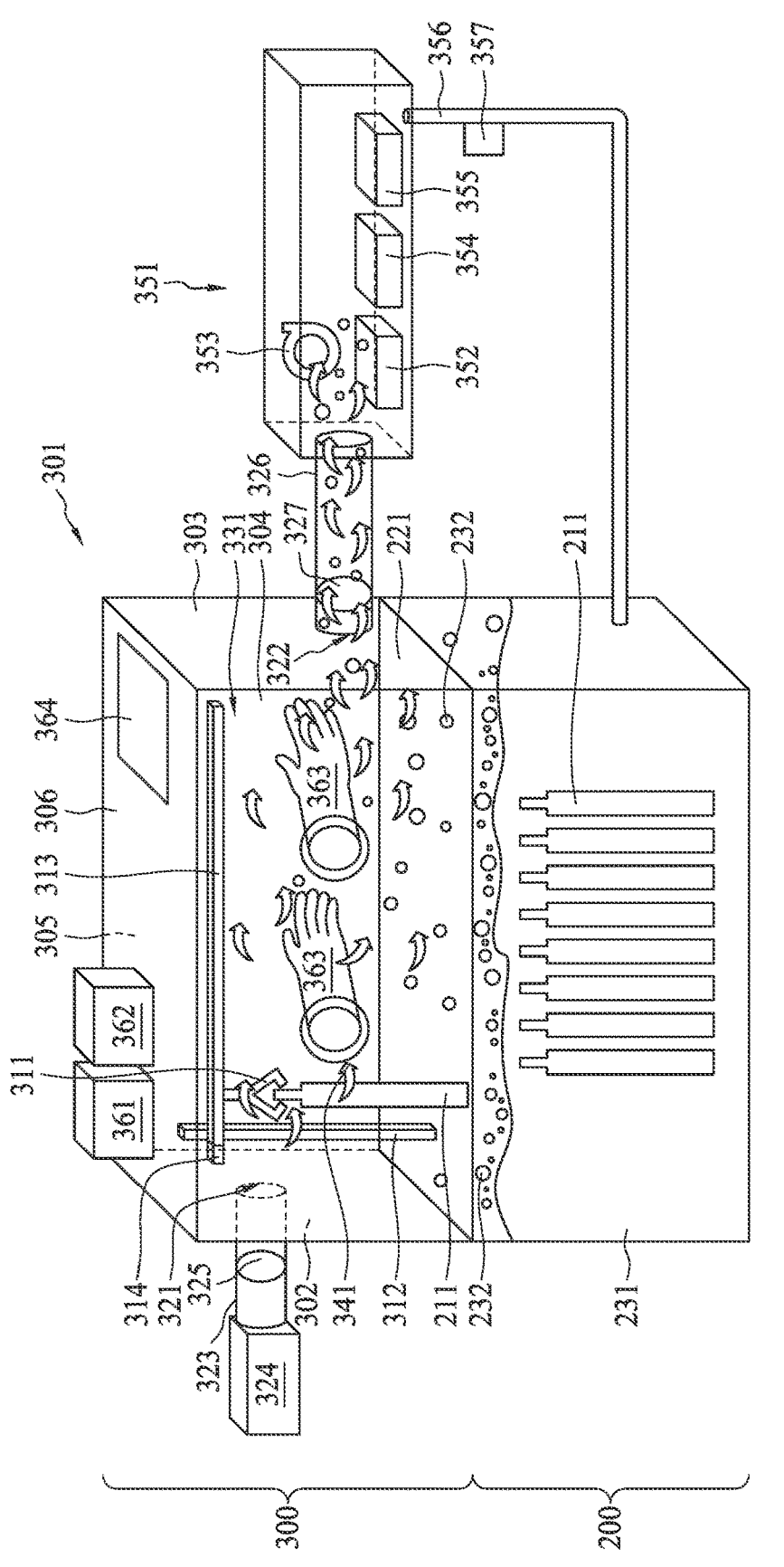

In operation O108, referring to FIG. 12, the gas 341 and the vaporized coolant 232 are discharged out of the chamber 331 through the outlet 322. In some embodiments, during the supplying of the gas 341, the gas 341 and the vaporized coolant 232 are discharged out of the chamber 331 through the outlet 322. In some embodiments, after the supplying of the gas 341, the gas 341 and the vaporized coolant 232 are discharged out of the chamber 331 through the outlet 322. In some embodiments, the first valve 325 is closed after the supplying of the gas 341.

In some embodiments, a second valve 327 is opened, and the gas 341 and the vaporized coolant 232 are discharged out of the chamber 331 and enter a second gas conduit 326 through the outlet 322. In some embodiments, the discharged gas 341 and the vaporized coolant 232 enter a collector 351. In some embodiments, the control system 361 controls the supplying of the gas 341, the condition of the chamber 331, and the configurations of the first valve 325 and the second valve 327. In some embodiments, the sensing unit 362 senses the condition of the chamber 331 in real time, and the control system 361 controls the configurations of the first valve 325 and the second valve 327.

Figure 13:
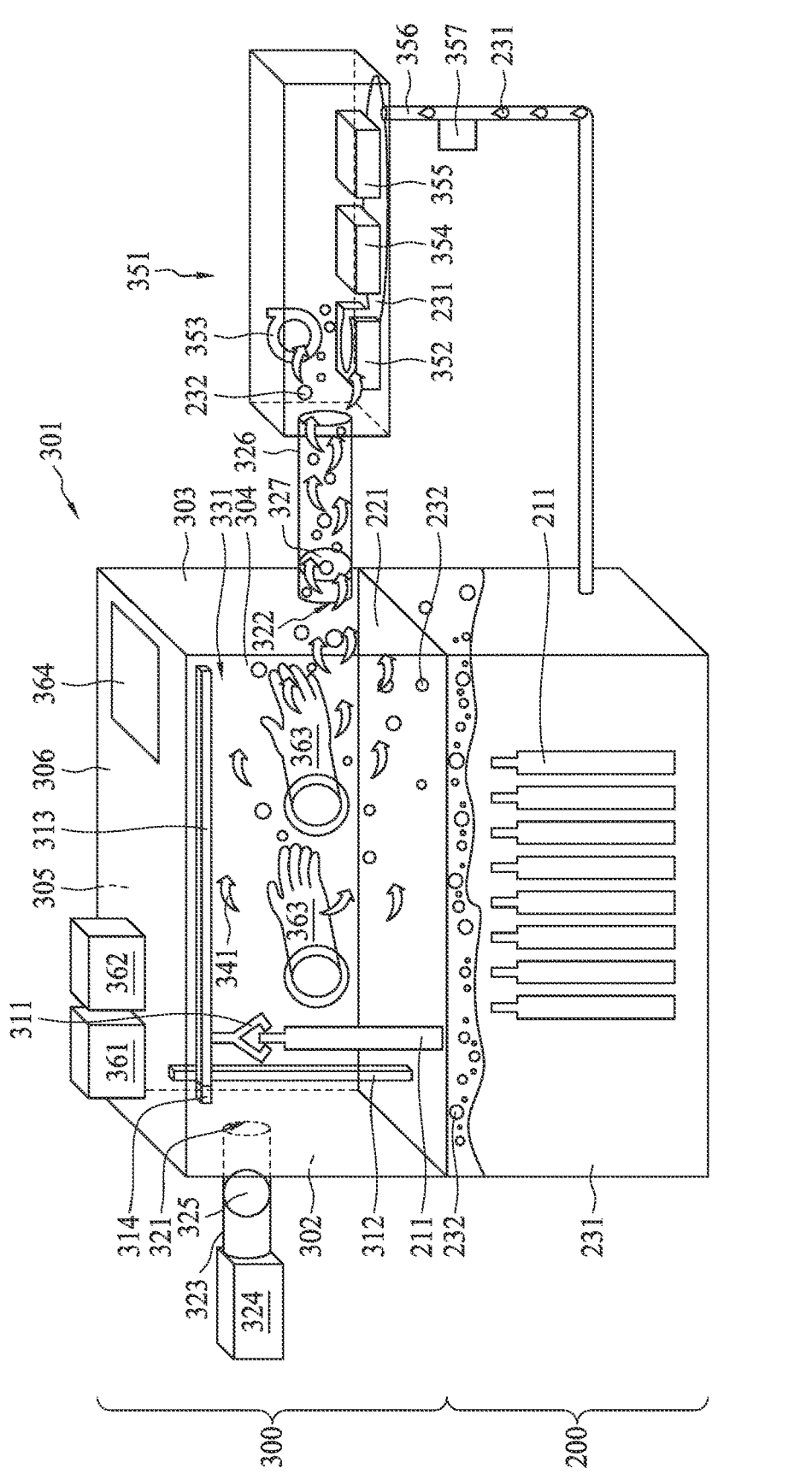

In some embodiments, referring to FIG. 13, the method M10 further includes condensing the vaporized coolant 232 into the coolant 231. In some embodiments, a condenser 352 condenses the vaporized coolant 232 into the coolant 231 in liquid state. In some embodiments, the vaporized coolant 232 is condensed in the collector 351.

In some embodiments, a fluid from the chamber 331 including the coolant 231 is condensed by the condenser 352. In some embodiments, a separator 354 separates the coolant 231 from the fluid. In some embodiments, a purifier 355 purifies the coolant 231 collected by the collector 351. In some embodiments, the composition and the properties of the coolant 231 in the tank 200 and the coolant 231 in the collector 351 are substantially the same. In some embodiments, the coolant 231 condensed by the condenser 352 is returned back to the tank 200 through a refill unit 356 connecting the collector 351 and the tank 200. In some embodiments, the coolant 231 condensed by the condenser 352 is delivered from the collector 351 back to the tank 200 by a pump 357 or the like.

In some embodiments, the method M10 further includes repairing or adjusting the computing device 211 in the chamber 331. A user may access the chamber 331 by using a glove 363 disposed on the housing 301. In some embodiments, the method M10 further includes moving the computing device 211 out of the chamber 331 through a door 364 after the vaporized coolant 232 is discharged out of the chamber 331. In some embodiments, the method M10 further includes moving the computing device 211 toward the door 364 by moving the gripping member 311.

Figure 14:
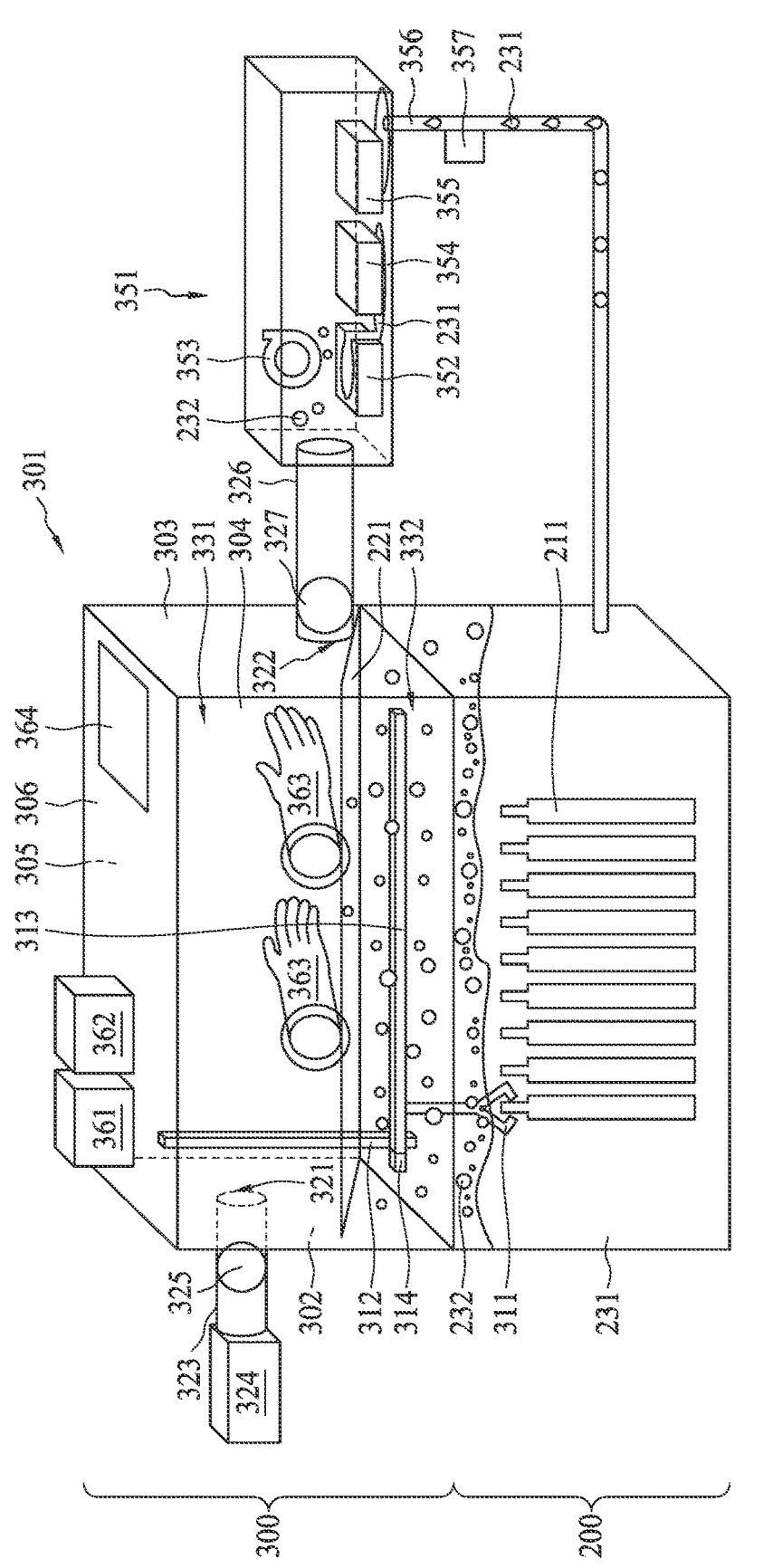

In some embodiments, referring to FIG. 14, the method M10 further includes opening the lid 221 after the discharging of the vaporized coolant 232 out of the chamber 331 and moving the computing device 211 toward the tank 200 to immerse the computing device 211 in the coolant 231. In some embodiments, the first valve 325 and the second valve 327 are closed while the lid 221 is open. In some embodiments, the computing device 211 is moved by extending the gripping member 311 toward the tank 200. In some embodiments, the gripping member 311 holds the computing device 211 during the movement.

Figure 15:
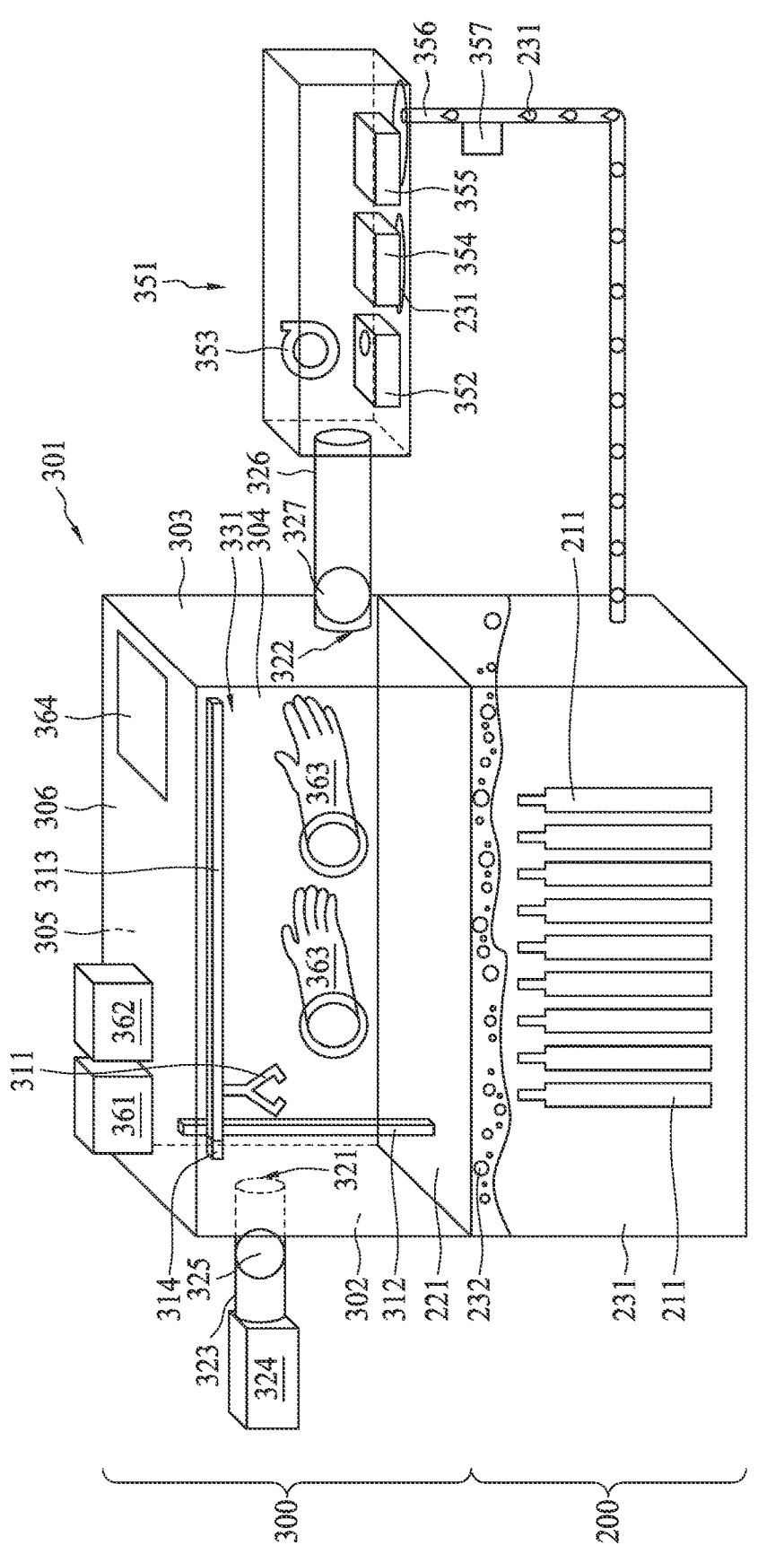

In some embodiments, referring to FIG. 15, the method M10 further includes placing the computing device 211 at a desired position in the tank 200, retracting the gripping member 311 away from the tank 200, and closing the lid 221.

Figure 16:
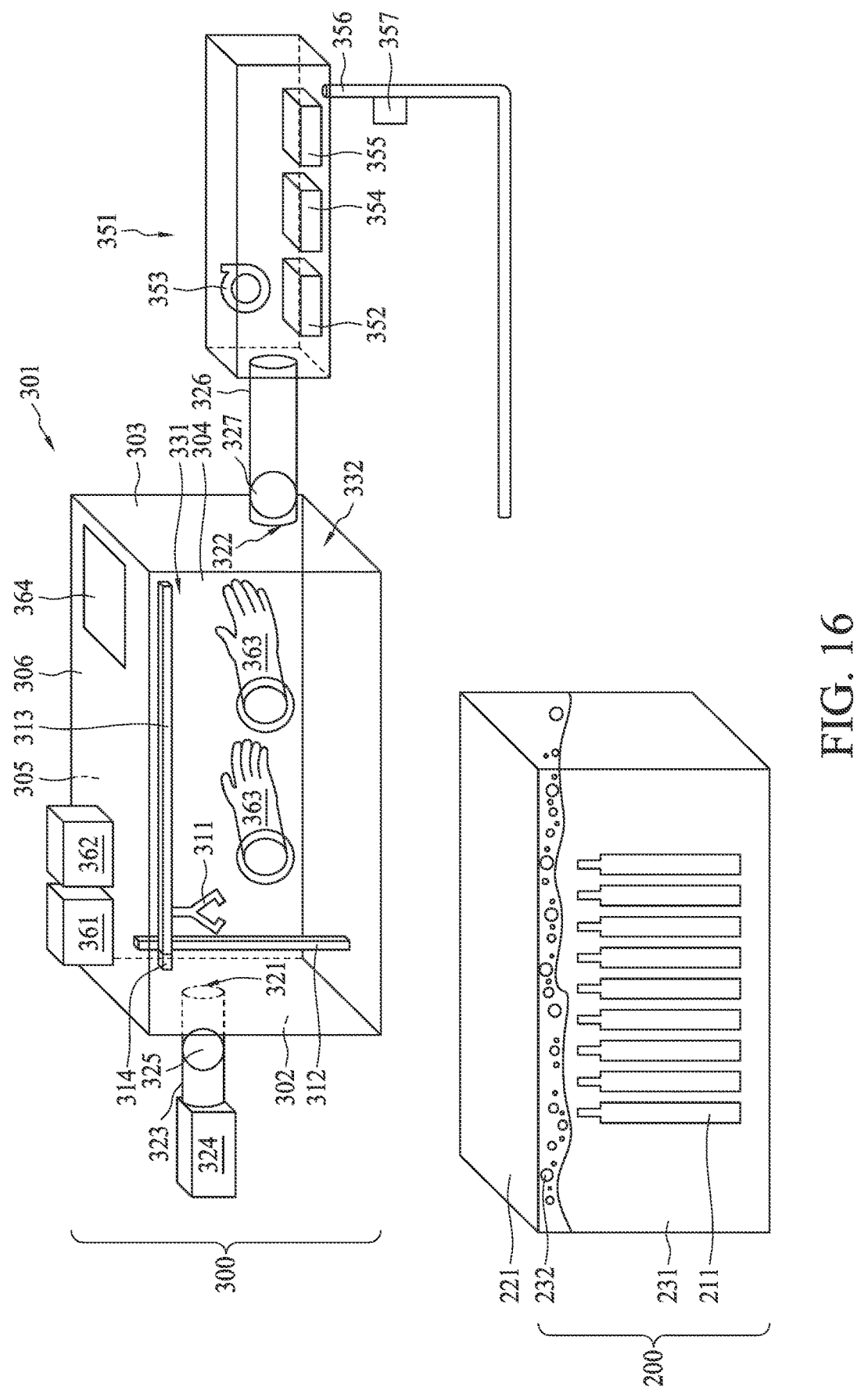

In some embodiments, referring to FIG. 16, the method M10 further includes removing the fluid collecting apparatus 300 from the tank 200. In some embodiments, the fluid collecting apparatus 300 is detachable from the tank 200. In some embodiments, the chamber 331 is in communication with the external environment through the opening 332. In some embodiments, the tank 200 is covered by the lid 221 to isolate the coolant 231, the vaporized coolant 232 and the computing devices 211 from the external environment. In some embodiments, the fluid collecting apparatus 300 can then be attached to another tank similar to the tank 200 when another computing device immersed in another tank is required to be picked out for repairing, checking, etc. In some embodiments, the fluid collecting apparatus 300 is portable.

One aspect of this disclosure relates to a fluid collecting apparatus. The fluid collecting apparatus includes a housing, a gripping member, an inlet, and an outlet. The housing includes a first sidewall, a second sidewall opposite to the first sidewall, a chamber surrounded by the first sidewall and the second sidewall, and an opening for accessing the chamber. The gripping member is movable within the chamber, extendable toward or retractable away from the opening, and is configured to hold a computing device. The inlet is disposed on the first sidewall, communicable with the chamber and configured to deliver a gas into the chamber. The outlet is disposed on the second sidewall, communicable with the chamber and configured to discharge the gas out of the chamber.

In some embodiments, the fluid collecting apparatus further includes a lid disposed at the opening and configured to open or close the chamber. In some embodiments, the inlet is disposed at a level substantially higher than the outlet. In some embodiments, the gripping member is movable along a first rail or a second rail substantially orthogonal to the first rail. In some embodiments, the fluid collecting apparatus further includes a collector adjacent to the outlet and configured to collect the gas, a vapor, or a fluid from the chamber. In some embodiments, the fluid collecting apparatus further includes a condenser disposed adjacent to the outlet and configured to condense a vapor from the chamber into a liquid. In some embodiments, the fluid collecting apparatus further includes a first valve disposed at the inlet and configured to control whether the gas enters the chamber through the inlet.

An aspect of this disclosure relates to a cooling system. The cooling system includes a tank configured to hold a coolant and a computing device therein, and further includes a lid configured to cover the tank and a fluid collecting apparatus disposed over the tank. The fluid collecting apparatus includes a housing, a gripping member, an inlet, and an outlet. The housing includes a first sidewall, a second sidewall opposite to the first sidewall, a chamber surrounded by the first sidewall and the second sidewall, and an opening for accessing the chamber. The gripping member is movable within the chamber, extendable toward or retractable away from the tank, and configured to hold a computing device. The inlet is disposed on the first sidewall, communicable with the chamber and configured to deliver a gas into the chamber. The outlet is disposed on the second sidewall, communicable with the chamber and configured to discharge the gas out of the chamber.

In some embodiments, a dimension of the tank is substantially same as a dimension of the housing. In some embodiments, a temperature of the gas is substantially higher than a boiling point of the coolant. In some embodiments, the gripping member is extendable to load the computing device into the tank or retractable to remove the computing device from the tank. In some embodiments, the lid is disposed between the tank and the fluid collecting apparatus. In some embodiments, the cooling system further includes a glove arranged on a third sidewall of the fluid collecting apparatus and configured to access the chamber.

An aspect of this disclosure relates to a method of operating a cooling system. The method includes receiving a tank, a coolant held by the tank, a computing device immersed in the coolant, and a lid covering the tank; and disposing a fluid collecting apparatus over the tank, wherein the fluid collecting apparatus includes a housing defined with a chamber, a gripping member movable within the chamber, an inlet disposed on a sidewall of the housing and communicable with the chamber, and an outlet disposed on the sidewall and communicable with the chamber. The method further includes opening the lid; gripping the computing device by the gripping member; moving the computing device out of the tank toward the fluid collecting apparatus; closing the lid; supplying a gas from the inlet to be blown against the computing device; and discharging the gas and a vaporized coolant out of the chamber through the outlet.

In some embodiments, the method further includes condensing the vaporized coolant into the coolant; and returning the coolant back to the tank. In some embodiments, a temperature of the chamber is substantially higher than 50° C. In some embodiments, the gas is blown against the computing device at a velocity between about 2 m/s and about 5 m/s. In some embodiments, the method further includes aligning the gripping member with the computing device. In some embodiments, the method further includes: opening the lid after the discharging; moving the computing device toward the tank to immerse the computing device in the coolant; closing the lid; and removing the fluid collecting apparatus from the tank. In some embodiments, a duration of the supplying of the gas is between about 5 minutes and about 10 minutes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A cooling system, comprising:
a tank configured to hold a coolant and a computing device therein;
a lid configured to cover the tank;
a fluid collecting apparatus disposed over the tank and including:

a housing including a first sidewall, a second sidewall opposite to the first sidewall, and a chamber surrounded by the first sidewall and the second sidewall;
a gripping member movable within the chamber, extendable toward or retractable away from the tank, and configured to hold the computing device;
an inlet disposed on the first sidewall, communicable with the chamber and configured to deliver a gas into the chamber; and
an outlet disposed on the second sidewall, communicable with the chamber and configured to discharge the gas out of the chamber,
wherein the lid is disposed between the tank and the fluid collecting apparatus.

2. The cooling system of claim 1, wherein a dimension of the tank is substantially same as a dimension of the housing.

3. The cooling system of claim 1, wherein a temperature of the gas is substantially higher than a boiling point of the coolant.

4. The cooling system of claim 1, wherein the gripping member is extendable to load the computing device into the tank or retractable to remove the computing device from the tank.

5. The cooling system of claim 4, wherein the gripping member is movable along a first rail or a second rail substantially orthogonal to the first rail.

6. The cooling system of claim 1, wherein the lid is disposed between the tank and the fluid collecting apparatus.

7. The cooling system of claim 1, further comprising a glove arranged on a third sidewall of the fluid collecting apparatus and configured to access the chamber.

8. The cooling system of claim 1, further comprising a condenser disposed adjacent to the outlet and configured to condense the coolant vaporized from the tank into a liquid.

9. The cooling system of claim 1, further comprising a collector coupled to the outlet and configured to collect the gas or the coolant discharged from the outlet.

10. A cooling system, comprising:
a housing defined with a chamber, and including an inlet configured to deliver a gas into the chamber and an outlet configured to discharge the gas out of the chamber;
a gripping member movable within the chamber;
a tank disposed under the housing and configured to hold a coolant and a computing device immersed in the coolant;
a lid configured to cover the tank; and
a collector coupled to the outlet and configured to collect the gas or the coolant discharged from the outlet,
wherein the lid is disposed between the tank and the housing.

11. The cooling system of claim 10, wherein a volume of the housing is substantially same as a volume of the tank.

12. The cooling system of claim 10, further comprising a refill unit connecting the collector to the tank and configured to deliver the coolant collected by the collector back to the tank.

13. The cooling system of claim 10, wherein the housing includes a door for accessing the chamber, the computing device enters into or exits from the housing through the door.

14. A cooling system, comprising:
a housing defined with a chamber, and including an inlet configured to deliver a gas into the chamber and an outlet configured to discharge the gas out of the chamber;
a first valve disposed at the inlet;

a second valve disposed at the outlet;

a gripping member movable within the chamber;

a tank disposed under the housing and configured to hold a coolant and a computing device immersed in the coolant;

a lid configured to cover the tank; and a control system electrically connected to the gripping member, the first valve and the second valve, wherein the lid is disposed between the tank and the housing.

15. The cooling system of claim 14, further comprising a collector coupled to the outlet and configured to collect the gas or the coolant discharged from the outlet.

16. The cooling system of claim 14, further comprising a sensing unit configured to provide information regarding the cooling system to the control system.

17. The cooling system of claim 14, further comprising a gas source connected to the inlet.

18. The cooling system of claim 15, further comprising a separator disposed in the collector and configured to separate the coolant from a fluid supplied from the chamber.

19. The cooling system of claim 15, further comprising a purifier disposed in the collector and configured to purify the coolant collected by the collector.

20. The cooling system of claim 15, further comprising a refill unit connecting the collector to the tank and configured to deliver the coolant collected by the collector back to the tank.

\* \* \* \* \*